US005909033A

United States Patent [19]

Koga et al.

[11] Patent Number: 5,909,033

[45] Date of Patent: Jun. 1, 1999

[54] VACUUM-SEALED FIELD-EMISSION ELECTRON SOURCE AND METHOD OF MANUFACTURING THE SAME

[75] Inventors: Keisuke Koga; Kiyoyuki Morita, both of Kyoto, Japan

[73] Assignee: Matsushita Electric Industrial Co., Ltd., Osaka, Japan

[21] Appl. No.: 08/967,020

[22] Filed: Nov. 10, 1997

[30] Foreign Application Priority Data

Nov. 11, 1996 [JP] Japan .................................... 8-298765

[51] Int. Cl.[6] .................................................... H01L 29/06

[52] U.S. Cl. ................................ 257/10; 445/24; 438/20; 315/169.1; 313/309; 313/336

[58] Field of Search ................................ 445/24; 438/20; 315/169.1; 313/309, 336; 257/10

[56] References Cited

U.S. PATENT DOCUMENTS

| | | | |
|---|---|---|---|
| 5,199,917 | 4/1993 | MacDonald et al. | 445/24 |
| 5,349,217 | 9/1994 | Boysel . | |
| 5,367,181 | 11/1994 | Yoshida | 257/91 |
| 5,532,177 | 7/1996 | Cathey | 437/40 |
| 5,695,378 | 12/1997 | Hecker, Jr. et al. | 445/24 |
| 5,760,470 | 6/1998 | Stansbury | 257/690 |

FOREIGN PATENT DOCUMENTS

| | | |
|---|---|---|
| 08293244 | 11/1996 | European Pat. Off. . |
| 06342633 | 12/1994 | Japan . |
| 7604568 | 4/1976 | Netherlands . |
| WO 9619009 | 6/1996 | WIPO . |

*Primary Examiner*—Olik Chaudhuri
*Assistant Examiner*—Douglas A. Wille
*Attorney, Agent, or Firm*—McDermott, Will & Emery

[57] ABSTRACT

A recess portion in a bowl-like shape is formed at the center of a silicon substrate, and plural cathodes are formed in a matrix with a predetermined distance therebetween on the bottom of the recess portion. Around each cathode on the silicon substrate, a withdrawn electrode is formed with an insulating film disposed therebelow. A first wire layer connected with the withdrawn electrode at one end extends along a slant side face of the recess portion and on the top face of a protrusion portion. A sealing cover in the shape of a flat plate of a transparent glass plate or the like is integrated with the silicon substrate with a circular sealing material disposed therebetween. A space formed among the silicon substrate, the circular sealing material and the sealing cover is retained to be vacuated.

8 Claims, 7 Drawing Sheets

VACUUM-SEALED FIELD-EMISSION ELECTRON SOURCE AND METHOD OF MANUFACTURING THE SAME

BACKGROUND OF THE INVENTION

The present invention relates to a field-emission electron source having prospective applications to an electron-beam-induced laser, a flat solid display device and a ultra-high-speed extremely small vacuum element. More particularly, it relates to a vacuum-sealed field-emission electron source, for use in a compact flat display device, in which a space formed between a semiconductor substrate and a sealing cover is retained to be vacuated, and a method of manufacturing the vacuum-sealed field-emission electron source.

In the field of a field-emission electron source, since development of a semiconductor micro-fabrication technology has enabled the formation of a refined cathode, the technology of vacuum microelectronics has been more and more vigorously developing.

In order to realize a high-performance electron source operable at a lower driving voltage, various attempts have been made to decrease the diameter of the opening of a withdrawn electrode and to manufacture a sharply pointed cathode by utilizing a semiconductor substrate and adopting the LSI technology.

In considering the application of an electron source to a flat display device, it is significant to attain the structure of a vacuum vessel for holding a cathode array portion in a highly vacuum atmosphere capable of electron emission and also to attain a definite vacuum sealing technique.

FIG. 6 is a sectional view of a conventional vacuum-sealed field-emission electron source disclosed in Japanese Laid-Open Patent Publication No. 6-342633. As is shown in FIG. 6, an n-type impurity diffused region 101 is formed in a part of a p-type silicon substrate 100, and on the other part of the p-type silicon substrate 100 not bearing the n-type impurity diffused region 101, plurality of cathodes 102 each in the shape of a spine, together corresponding to a cathode array portion, are formed. Around each of the cathodes 102, a withdrawn electrode 104 is formed with an insulating film 103 disposed therebelow. Each withdrawn electrode 104 is electrically connected with the n-type impurity diffused region 101 through a wire layer 105.

Above the silicon substrate 100, a sealing cover 110 having a recess portion 110*a* at the center and made from a transparent and insulating material such as glass is provided. A peripheral portion 110*b* of the sealing cover 110 is positioned substantially at the center of the n-type impurity diffused region 101 of the silicon substrate 100. On the bottom of the recess portion 110*a* of the sealing cover 110, an anode 111 of a transparent conductive material for converging electrons emitted by the cathodes 102 is disposed. Below the anode 111 is formed a fluorescent thin film not shown.

At the outer side on the n-type impurity diffused region 101 of the silicon substrate 100, an outer electrode connection terminal 106 is provided. The outer electrode connection terminal 106 is electrically connected with the wire layer 105 through the n-type impurity diffused region 101.

In this conventional vacuum-sealed field-emission electron source, the withdrawn electrode 104 is electrically connected with the external electrode connection terminal 106 through the wire layer 105 and the n-type impurity diffused region 101 formed in the silicon substrate 100. Therefore, there is no need to form a wire layer on a portion of the silicon substrate 100 opposing the peripheral portion 110*b* of the sealing cover 110. As a result, no step is formed by a wire on the portion of the silicon substrate 100 opposing the peripheral portion 110*b* of the sealing cover 110. Accordingly, this field-emission electron source is good at airtightness between the silicon substrate 100 and the sealing cover 110.

In the vacuum-sealed field-emission electron source, under application of a bias voltage of, for example, approximately 60 V to the withdrawn electrode 104, a control voltage of approximately ±10 V is applied to the withdrawn electrode 104, so as to control the on/off operation of the electron emission from the cathodes 102. Specifically, it is necessary to apply the control voltages generally having a potential difference of several tens volts, for example, approximately 20 V, to the withdrawn electrode 104. Also, there is a pn junction in the interface between the p-type silicon substrate 100 and the n-type impurity diffused region 101, and the pn junction has a stray capacitance depending upon a junction capacitance. In order to electrically connect the external electrode connection terminal 106 with the wire layer 105 through the n-type impurity diffused region 101, the area of the n-type impurity diffused region 101 is unavoidably enlarged, resulting in increasing the stray capacitance of the pn junction.

As power consumption is in proportion to a product of an applied control voltage and a stray capacitance, in order to control the on/off operation of the electron emission from the cathodes 102, the power consumption is unavoidably increased for the aforementioned reason.

Furthermore, when an impurity is ununiformly diffused in forming the n-type impurity diffused region 101, a junction defect is caused in the pn junction under application of a high voltage. Therefore, the characteristic of the resultant field-emission electron source can be disadvantageously degraded in its reliability.

Moreover, in the conventional vacuum-sealed field-emission electron source, it is necessary to converge the electrons emitted by the cathodes 102 onto the anode 111 through the fluorescent thin film under application of a voltage of 100 V or more to the anode 111. However, when the field-emission electron source is to be applied to a small and refined display panel, in view of the pitch between wire layers, it is very difficult to take the electrons converged onto the anode 111 out of the sealing cover 110 through the wire layers. This problem will now be described in detail.

FIG. 7 shows a circuit configuration for line control in a matrix display panel. In FIG. 7, a reference numeral 130 denotes the matrix display panel, a reference numeral 131 denotes an X line controller for controlling lines in the X direction, a reference numeral 132 denotes a Y line controller for controlling lines in the Y direction, $X_1$, $X_2$, $X_3$, . . . and $X_n$ respectively indicate wires extending in the X direction controlled by the X line controller 131, and $Y_1$, $Y_2$, $Y_3$, . . . and $Y_n$ respectively indicate wires extending in the Y direction controlled by the Y line controller 132.

For example, in the case of realizing a display of the VGA standard with a panel size of 1 inch or less, the pitches between the wires in the X direction and between those in the Y direction are both 30 μm or less, and hence, a very refined wiring technique is required. According to the current semiconductor processing technology, it is possible to form wires with such a refined pitch on a flat plane but is difficult to form them on a solid structure. Accordingly, in the aforementioned conventional vacuum-sealed field-emission electron source, it is difficult to form the wires with a refined pitch extending from the anode 111 so as to extend windingly along the bottom and the side face of the recess portion 110*a* of the sealing cover 110 and to pass between the n-type impurity diffused regions 101. Also, the switching operation of the anode 111 requires anode wires in plural layers, but it is very difficult to form the plural wire layers along the bottom and the side face of the recess 110*a* of the sealing cover 110.

Although it is possible to consider a special wire configuration, for example, in which the sealing cover 110 is provided with through holes for the connection of the wires extending from the anode 111 with the outside of the sealing cover 110, other problems such as an increased number of manufacturing procedures and an increased manufacturing cost can occur when such a special configuration is adopted.

SUMMARY OF THE INVENTION

In view of the aforementioned conventional problems, a first object of the invention is decreasing the power consumption for the on/off control of the electron emission from cathodes in a vacuum-sealed field-emission electron source, while attaining a stable characteristic thereof. A second object is realizing a display of the VGA standard with a panel size of 1 inch or less.

For achieving the first object, according to the present invention, a semiconductor substrate is provided with a recess portion, a cathode and a withdrawn electrode are formed on the bottom of the recess portion, and a withdrawn electrode wire extending from the withdrawn electrode is formed along the side face of the recess portion and the top face of a protrusion portion formed around the recess portion.

Specifically, the vacuum-sealed field-emission electron source of this invention comprises a semiconductor substrate; a recess portion formed in the semiconductor substrate; a cathode formed on a bottom of the recess portion of the semiconductor substrate out of a semiconductor material; a withdrawn electrode, for causing electron emission from the cathode, formed out of a conductive material on the bottom of the recess portion of the semiconductor substrate with an insulating layer disposed therebelow, the withdrawn electrode having an opening in a position corresponding to the cathode; a sealing cover made from a transparent and insulating flat plate and disposed so as to cover the recess portion of the semiconductor substrate; and a withdrawn electrode wire formed on a side face of the recess portion of the semiconductor substrate and on a top face of a protrusion portion formed around the recess portion, one end of the withdrawn electrode wire being connected with the withdrawn electrode and the other end extending to the outside, wherein a space formed by the semiconductor substrate and the sealing cover is retained to be vacuated.

In the vacuum-sealed field-emission electron source of this invention, the withdrawn electrode is connected with the outside through the withdrawn electrode wire extending along the side face of the recess portion and the top face of the protrusion portion formed around the recess portion of the semiconductor substrate. Therefore, a stray capacitance of a pn junction as in the conventional vacuum-sealed field-emission electron source can be avoided. As a result, the problem of the increase in the power consumption as well as the problem of the degraded characteristic of the field-emission electron source due to an ununiform impurity concentration in an impurity diffused region can be avoided.

The vacuum-sealed field-emission electron source of this invention preferably further comprises an insulating circular sealing material disposed between the semiconductor substrate and the sealing cover so as to surround the recess portion.

Thus, the airtightness of the space formed among the semiconductor substrate, the circular sealing material and the sealing cover can be improved.

In the case where the vacuum-sealed field-emission electron source comprises the insulating circular sealing material, the circular sealing material is preferably integrated with the sealing cover, and a face of the circular sealing material in contact with the semiconductor substrate is preferably flattened.

Thus, since the airtightness of the space formed among the semiconductor substrate, the circular sealing material and the sealing cover is further improved, the reliability of the vacuum-sealed field-emission electron source can be improved.

Furthermore, in the case where the vacuum-sealed field emission electron source comprises the insulating circular sealing material, the field-emission electron source preferably further comprises an anode, for converging electrons emitted from the cathode, formed out of a conductive material on a surface of the sealing cover opposing the semiconductor substrate; a fluorescent thin film formed on a surface of the anode opposing the semiconductor substrate; and an anode wire formed on the surface of the sealing cover opposing the semiconductor substrate, one end of the anode wire being connected with the anode and the other end extending to the outside through the circular sealing material.

In this manner, since the anode is formed on the face of the sealing cover, in the shape of a flat plate, opposing the semiconductor substrate and the cathode is formed on the bottom of the recess portion of the semiconductor substrate, a distance between the cathode and the anode can be controlled by a depth of the recess portion of the semiconductor substrate which can be formed through a semiconductor process. Accordingly, the distance between the anode and the cathode can be made uniform, resulting in improving the reliability of the electron source. In addition, since there is no need to form a recess portion in the sealing cover, the manufacturing cost of the electron source can be decreased.

Furthermore, since the anode wire is formed on the face of the sealing cover, in the shape of a flat plate, opposing the semiconductor substrate and the insulating circular sealing material is disposed between the semiconductor substrate bearing the withdrawn electrode wire and the sealing cover bearing the anode wire, the pitch of the withdrawn electrode wire and that of the anode wire can be minimized. As a result, matrix drive of a cathode array in a compact field-emission electron source can be eased. In this case, since a stray capacitance derived from a pn junction is not caused, rapid matrix drive of the field-emission electron source can be realized by designing patterns of the anode wires and the withdrawn electrode wires to have small capacitances.

Moreover, since the sealing cover is in the shape of a flat plate, plural wire layers can be comparatively easily formed in the sealing cover. Therefore, the anode wires can be formed in plural layers in the sealing cover for the switching operation of the anode.

In this manner, the second object can be achieved.

In this case, the withdrawn electrode wire preferably extends along one direction, and the anode wire preferably extends along another direction crossing the extending direction of the withdrawn electrode. Thus, the matrix drive of the cathode array can be more definitely conducted.

The method of manufacturing a vacuum-sealed field-emission electron source of this invention comprises a recess forming step of forming a recess portion in a semiconductor substrate by forming a circular etching mask on the semiconductor substrate and conducting etching on the semiconductor substrate by using the etching mask; a cathode forming step of forming a cathode on a bottom of the recess portion of the semiconductor substrate out of a semiconductor material; a withdrawn electrode forming step of successively depositing an insulating film and a conductive film on an entire surface of the semiconductor substrate, removing the conductive film in a periphery portion of the cathode and patterning the conductive film, so as to form a withdrawn electrode, for causing electron emission from the cathode, having an opening in a position corresponding to the cathode, on the bottom of the recess portion of the semiconductor substrate with the insulating film disposed therebelow, and so as to form a withdrawn electrode wire one end of which is connected with the withdrawn electrode and the other end of which extends to an edge of the semiconductor substrate; an anode forming step of forming, on a sealing cover made from a transparent and insulating flat plate, an anode of a conductive material for converging electrons emitted by the cathode, and forming an anode wire one end of which is connected with the anode and the other end of which extends to an edge of the sealing cover; a fluorescent thin film forming step of forming a fluorescent thin film on the anode; a sealing material forming step of forming a circular sealing material having a flattened surface on a periphery of the sealing cover; and a vacuum-sealing step of integrating the semiconductor substrate and the sealing cover with the circular sealing material disposed therebetween and vacuating a space formed by the semiconductor substrate, the sealing cover and the sealing material.

In the method of manufacturing a vacuum-sealed field emission electron source of this invention, the semiconductor substrate is etched by using the circular etching mask formed on the semiconductor substrate, and hence, the formation of the recess portion in the semiconductor substrate is highly controllable.

Furthermore, after successively depositing the insulating film and the conducive film on the entire surface of the semiconductor substrate, the conductive film in the periphery of the cathode is removed and the conductive film is patterned. Therefore, the withdrawn electrode and the withdrawn electrode wire can be formed on the bottom of the recess portion of the semiconductor substrate with the insulating layer disposed therebelow.

Moreover, since the semiconductor substrate bearing the cathode, the withdrawn electrode and the withdrawn electrode wire is integrated with the sealing cover in the shape of a flat plate bearing the anode, the anode wire and the fluorescent thin film, with the insulating circular sealing material sandwiched therebetween, the withdrawn electrode formed on the semiconductor substrate and the anode wire formed on the sealing cover are insulated from each other by the circular sealing material.

Accordingly, since there is no need to form an impurity diffused region in the semiconductor substrate in the method of manufacturing a vacuum-sealed field-emission electron source of this invention, the impurity concentration in the impurity diffused region cannot be ununiform as well as a distance between the anode and the cathode can be controlled by a semiconductor process. Therefore, the reliability of the electron source can be improved. In addition, since there is no need to form a recess portion in the sealing cover, the manufacturing cost of the electron source can be decreased.

Furthermore, since the withdrawn electrode formed on the semiconductor substrate and the anode wire formed on the sealing cover are insulated from each other by the circular sealing material, successive line drive of the withdrawn electrode and the anode can be eased. As a result, the matrix drive of the cathode array can be conducted definitely and rapidly.

In the method of manufacturing a vacuum-sealed field-emission electron source, the semiconductor substrate is preferably a crystalline substrate, and the etching conducted in the recess portion forming step is preferably crystal anisotropic etching.

In such a case, since the recess portion is formed by the crystal anisotropic etching on the crystalline substrate, the depth of the recess portion formed in the semiconductor substrate can be accurately controlled. In addition, the recess portion can be formed to have a tapered side face with a larger dimension upward.

In the method of manufacturing a vacuum-sealed field a emission electron source, the sealing material forming step preferably includes a step of flattening the surface of the circular sealing material by chemical mechanical polishing.

In such a case, since the airtightness of the space formed among the semiconductor substrate, the circular sealing material and the sealing cover can be further improved, the reliability of the vacuum-sealed field-emission electron source can be improved.

DETAILED DESCRIPTION OF THE INVENTION

A vacuum-sealed field-emission electron source and a method of manufacturing the electron source according to a preferred embodiment of the invention will now be described.

Figure 1:
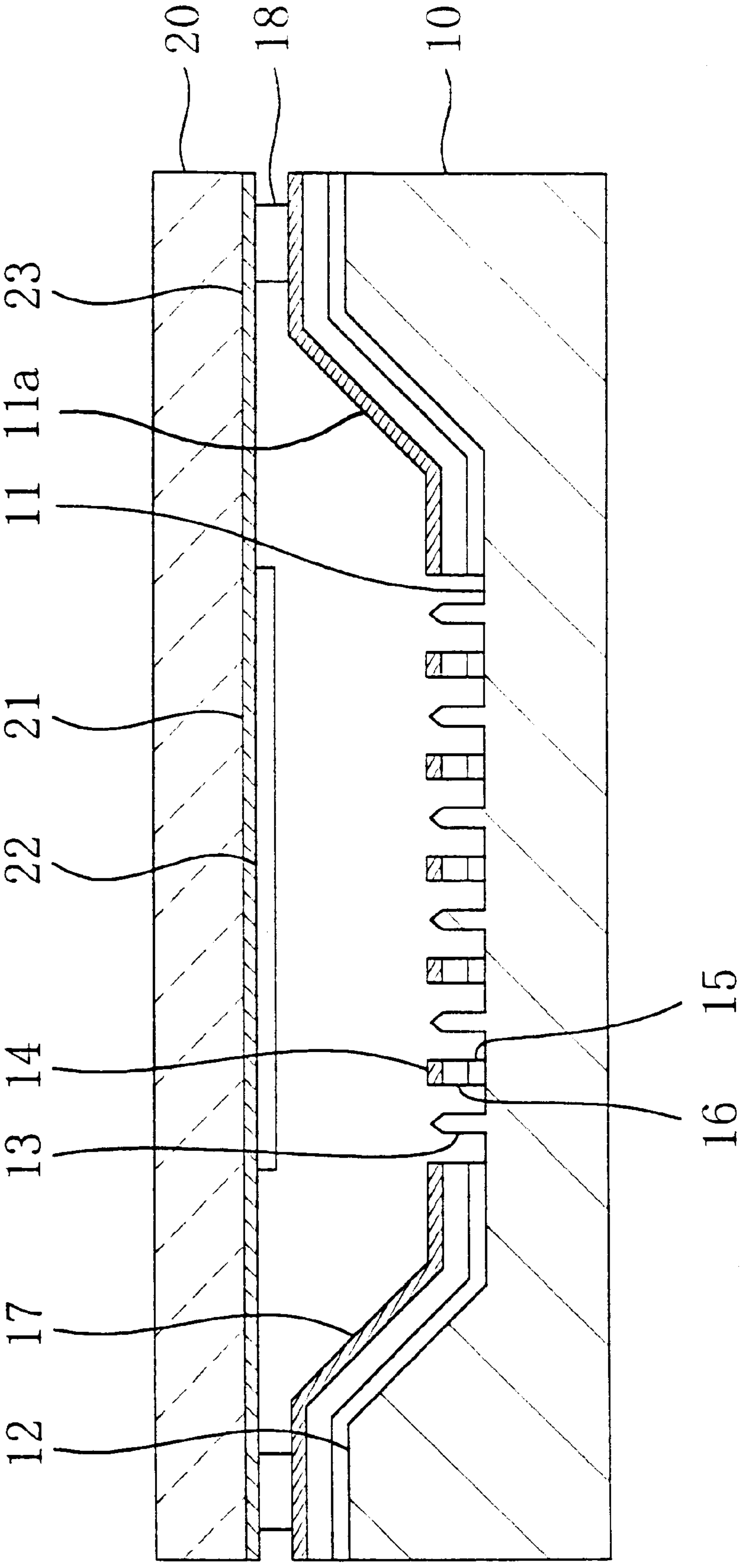
FIG. 1 is a sectional view of a vacuum-sealed field-emission electron source according to an embodiment of the invention.
Figure 2A:
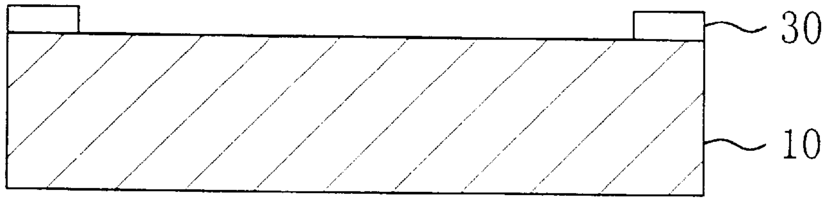
FIGS. 2(*a*) through 2(*d*) are sectional views for showing manufacturing procedures for the vacuum-sealed field-emission electron source of the embodiment.
Figure 2B:
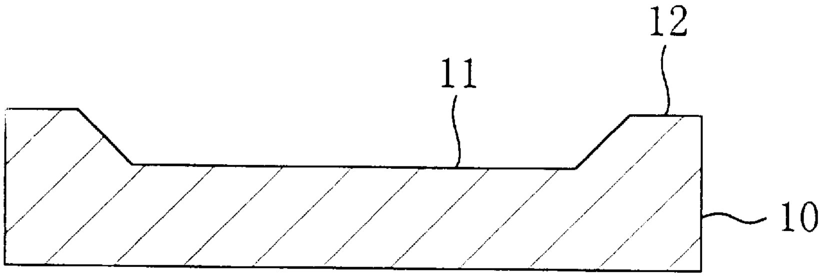
Figure 2C:
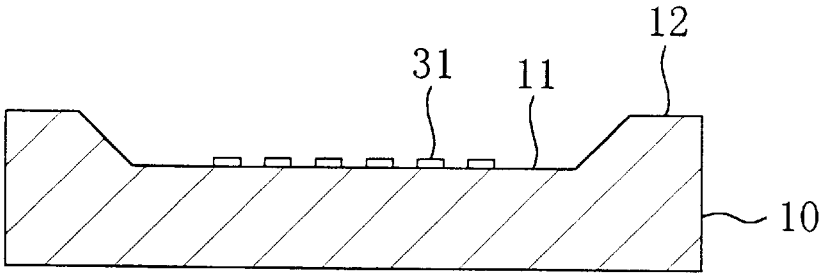
Figure 2D:
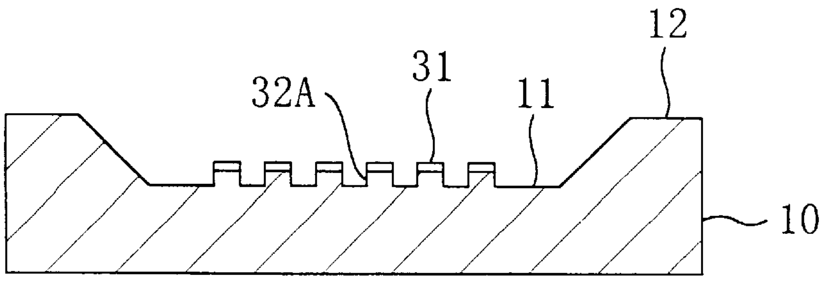
Figure 3A:
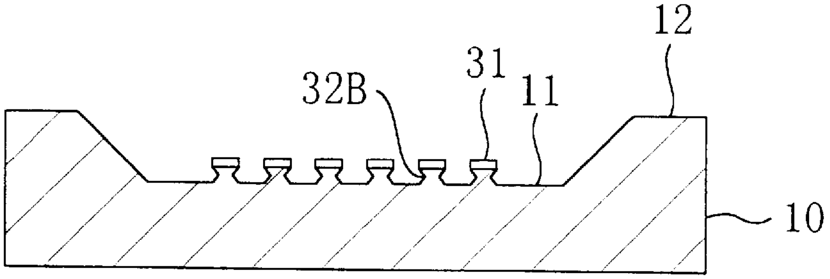
FIGS. 3(*a*) through 3(*d*) are sectional views for showing further manufacturing procedures for the vacuum-sealed field-emission electron source of the embodiment.
Figure 3B:
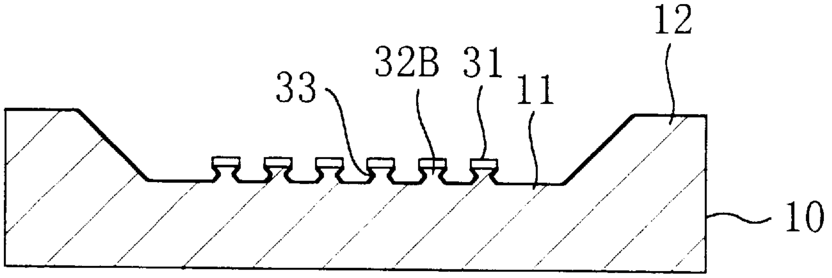
Figure 3C:
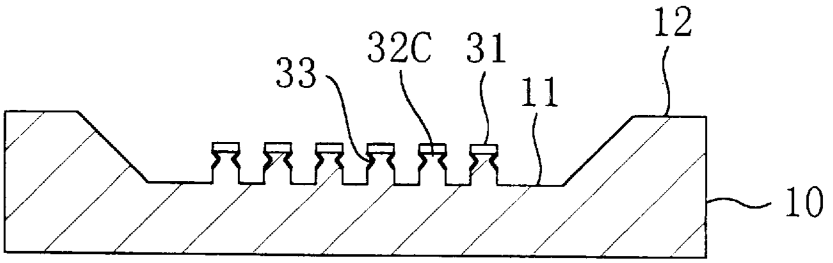
Figure 3D:
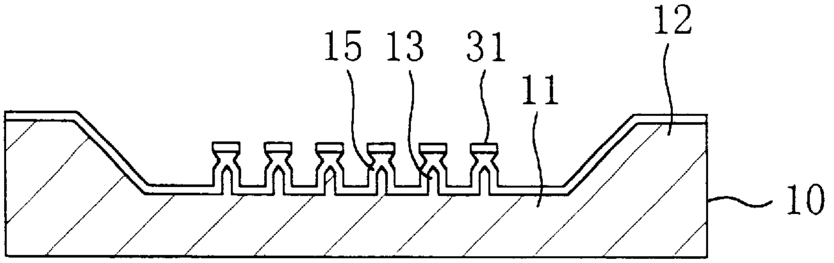

FIG. 1 illustrates a sectional structure of the vacuum-sealed field-emission electron source of this embodiment. As is shown in FIG. 1, a silicon substrate 10 of silicon crystal has a recess portion 11 in the shape of a bowl at the center thereof, and accordingly, also has a protrusion portion 12 around the recess portion 11. On the bottom of the recess portion 11 of the silicon substrate 10, a plurality of pillar-shaped cathodes 13 are formed in a matrix with a predetermined distance among one another, so that the plural cathodes 13 can together form a cathode array. Each of the cathodes 13 has a sharply pointed tip with a radius of 2 nm or less formed by crystal anisotropic etching and thermal oxidation of silicon.

Around each cathode 13 on the silicon substrate 10, a withdrawn electrode 14 having a refined opening with each cathode 13 as a center thereof is formed with an insulating film including a first silicon oxide film 15 and a second silicon oxide film 16 underlying therebelow. A first wire layer 17, one end of which is connected with the withdrawn electrode 14, is formed correspondingly to each line of cathodes 13 so as to extend over a slant side face 11*a* of the recess portion 11 and the top face of the protrusion portion 12 of the silicon substrate 10. The other end of the first wire layer 17 extends to the outside to be electrically connected with an external connection terminal not shown.

Above the silicon substrate 10, a sealing cover 20 in the shape of a flat plate made from a transparent glass plate or the like is disposed, so as to be integrated with the silicon substrate 10 with a circular sealing material 18, made from an insulating material, sandwiched between the sealing cover 20 and the protrusion portion 12 of the silicon substrate 10. A space formed among the silicon substrate 10, the circular sealing material 18 and the sealing cover 20 is vacuated until a predetermined degree of vacuum is attained, and then is vacuum-sealed with a glass sealing material having a low melting point or the like. At this point, in order to satisfactorily retain the airtightness of the space, the surface of the circular sealing material 18 to be in contact with the silicon substrate 10 has been subjected to a flattening process.

On the surface of the sealing cover 20 opposing the silicon substrate 10, an anode 21 of a transparent and conductive material and a fluorescent thin film 22 are successively formed. A second wire layer 23, one end of which is connected with the anode 21, is formed so as to extend correspondingly to each line to the outside through the circular sealing material 18. At this point, the second wire layer 23 and the first wire layer 17 extend at right angles, namely, the first wire layer 17 extends, for example, in the X direction and the second wire layer 23 extends in the Y direction.

In this embodiment, the second wire layer 23 of each line extending in one direction is formed along the surface of the sealing cover 20 in the shape of a flat plate, while the first wire layer 17 of each line extending in another direction perpendicular to the extending direction of the second wire layer 23 is formed along the surface of the protrusion portion 12 of the silicon substrate 10, and the circular sealing material 18 is disposed between the first wire layer 17 and the second wire layer 23. In other words, the first wire layer 17 extending from the withdrawn electrode 14 and the second wire layer 23 extending from the anode 21 are formed independently of each other. Therefore, even in the case of realizing a display of the VGA standard with a panel size of 1 inch or less, the first wire layer 17 and the second wire layer 23 can be easily formed.

Also, since the withdrawn electrode 14 and the external connection terminal are connected through the first wire layer 17, a stray capacitance cannot be generated in a pn junction as in the conventional vacuum-sealed field-emission electron source. Accordingly, the problem of the increase in the power consumption can be avoided. In addition, the problem of the degraded characteristic of the field-emission electron source due to an ununiform impurity concentration in the impurity diffused region can be avoided.

Furthermore, a distance between the cathode array including the plural cathodes 13 and the florescent thin film 22 formed on the anode 21 depends upon the depth of the recess portion 11 formed in the silicon substrate 10, which is controllable in the semiconductor process. Thus, a vacuum vessel with high reliability can be fabricated through a simple process. Accordingly, a step of forming a recess portion in a sealing cover of a glass plate, which is indispensable in the manufacture of the conventional vacuum-sealed field-emission electron source, can be omitted. As a result, it is possible to manufacture a vacuum vessel with high reliability at a low cost.

Now, a method of manufacturing the vacuum-sealed field-emission electron source of this embodiment will be described with reference to FIGS. 2(*a*) through 2(*d*), 3(*a*) through 3(*d*), 4(*a*) and 4(*b*), and 5(*a*) through 5(*d*).

First, on the (100) oriented surface of the silicon substrate 10 of silicon crystal, a silicon nitride film is deposited by sputtering or the like, and then, a resist pattern having an opening corresponding to an area excluding the peripheral portion is formed on the silicon nitride film by photolithography. Then, by using the resist pattern as a mask, the silicon nitride film is dry-etched, thereby forming a silicon nitride mask 30 of the silicon nitride film in the shape of a rectangular frame as is shown in FIG. 2(*a*). In this case, the orientation of the mask pattern of the silicon nitride mask 30 accords with the (110) oriented surface of the silicon substrate 10.

Next, by using the silicon nitride mask 30, the silicon substrate 10 is wet-etched by using an alkaline solution for crystal anisotropic etching including a KOH solution and the like, thereby forming the recess portion 11 in the shape of a bowl at the center of the silicon substrate 10 as well as the protrusion portion 12 at the periphery of the silicon substrate 10 as is shown in FIG. 2(*b*). In this case, since the silicon substrate 10 of silicon crystal is subjected to the crystal anisotropic etching, the recess portion 11 is formed to have a tapered side face having a larger dimension upward. Also, the depth of the recess portion 11 can be controlled by adjusting the etching conditions such as the concentration of the etching solution and the etching time. Then, the silicon nitride mask 30 is removed by using a hot solution of phosphoric acid.

Next, after forming a thermal oxide film on the entire surface of the silicon substrate 10, the thermal oxide film is subjected to the photolithography and the dry etching, thereby forming a disk-shaped silicon oxide mask 31 with a very small diameter for forming a cathode as is shown in FIG. 2(*c*).

Then, by using the silicon oxide mask 31, the anisotropic dry etching is conducted on the silicon substrate 10, thereby forming a cylindrical body 32A on-the bottom of the recess portion 11 of the silicon substrate 10 as is shown in FIG. 2(*d*).

Next, the cylindrical body 32A is wet-etched by using an etching solution having a crystal anisotropic property, such as a mixed solution including ethylenediamine and pyrocatechol, thereby changing the cylindrical body 32A into an hourglass body 32B having a side face including the (331) oriented surface and a furrow at the center as is shown in FIG. 3(*a*).

Then, for protection of the furrow of the hourglass body 32B, a thin thermal oxide film 33 with a thickness of, for example, approximately 10 nm is formed on the side face of the hourglass body 32B by thermal oxidation as is shown in FIG. 3(*b*). By using the silicon oxide mask 31 again, the anisotropic dry etching is conducted on the silicon substrate 10, so as to vertically etch the silicon substrate 10. Thus, the hourglass body 32B is changed into an hourglass pilar body 32C as is shown in FIG. 3(*c*).

Next, as is shown in FIG. 3(*d*), the first silicon oxide film 15 with a thickness of, for example, approximately 100 nm is formed on the hourglass pilar body 32C and the silicon substrate 10 by the thermal oxidation. In this manner, the cathode 13 is formed within the hourglass pilar body 32C.

Figure 4A:
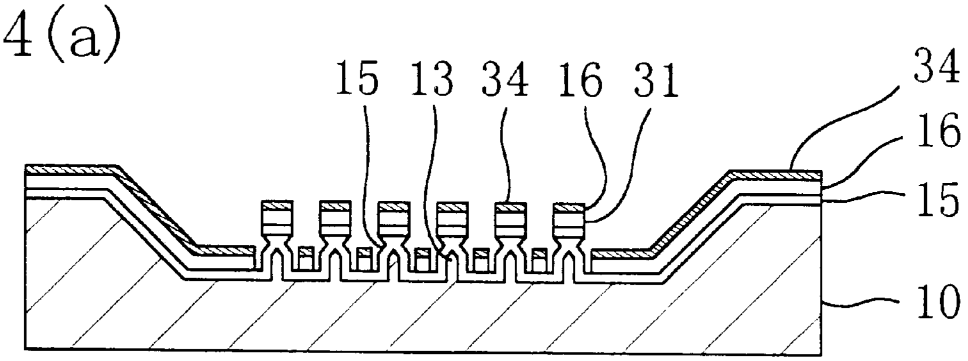
FIGS. 4(*a*) and 4(*b*) are sectional views for showing still further manufacturing procedures for the vacuum-sealed field-emission electron source of the embodiment.
Figure 4B:
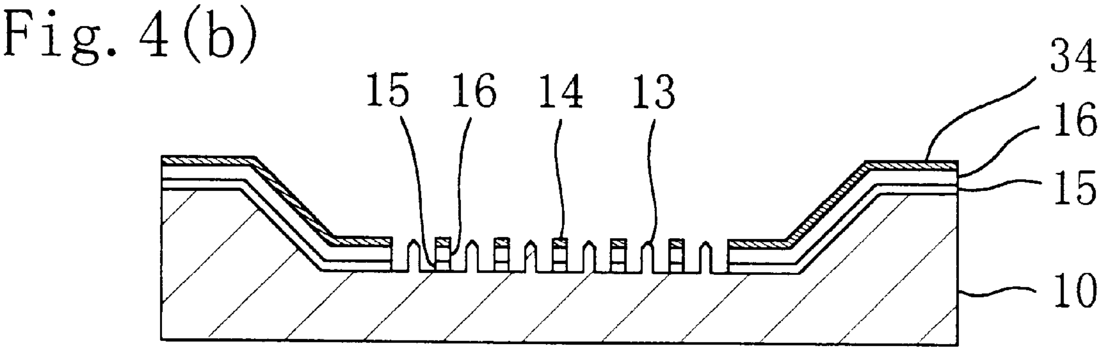
Figure 5A:
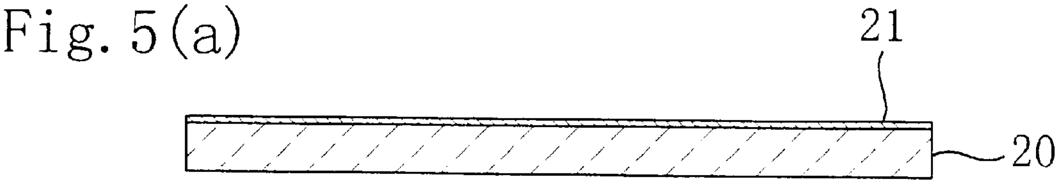
FIGS. 5(*a*) through 5(*d*) are sectional views for showing still further manufacturing procedures for the vacuum-sealed field-emission electron source of the embodiment.
Figure 5B:
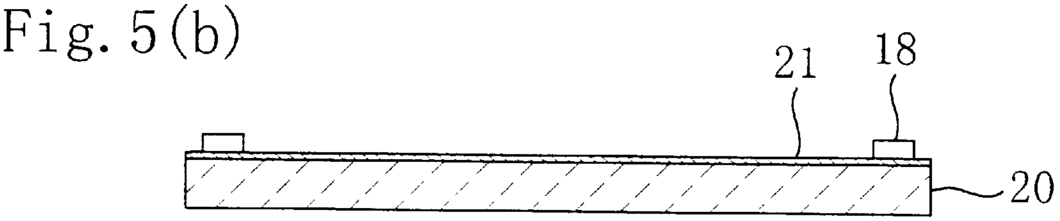
Figure 5C:
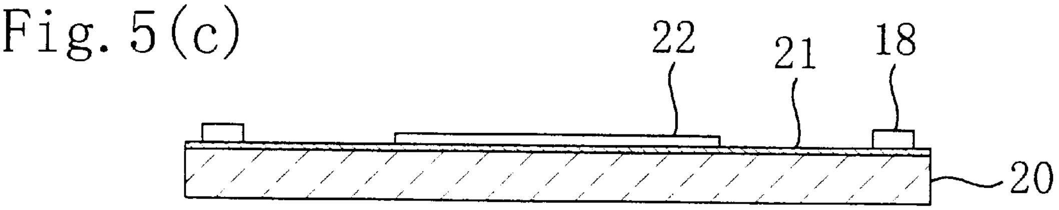
Figure 5D:
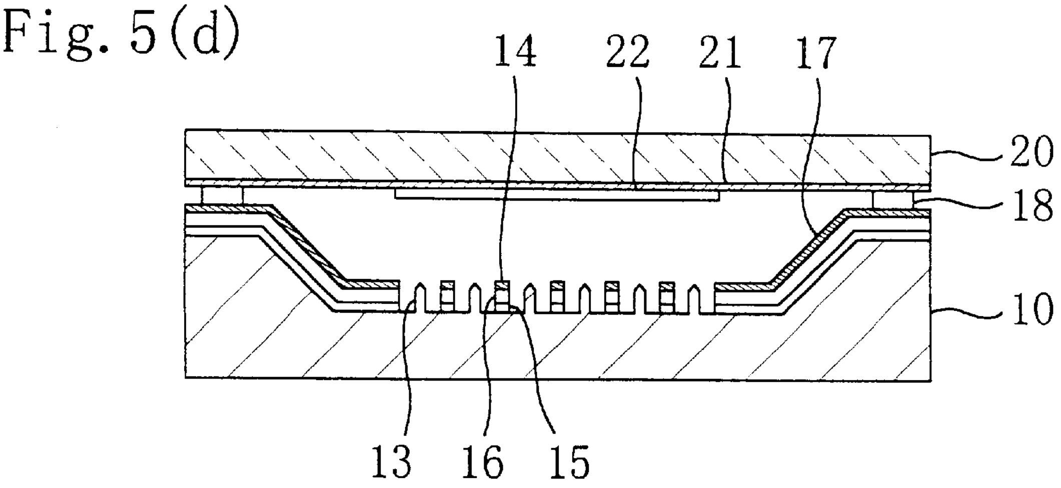
Figure 6:
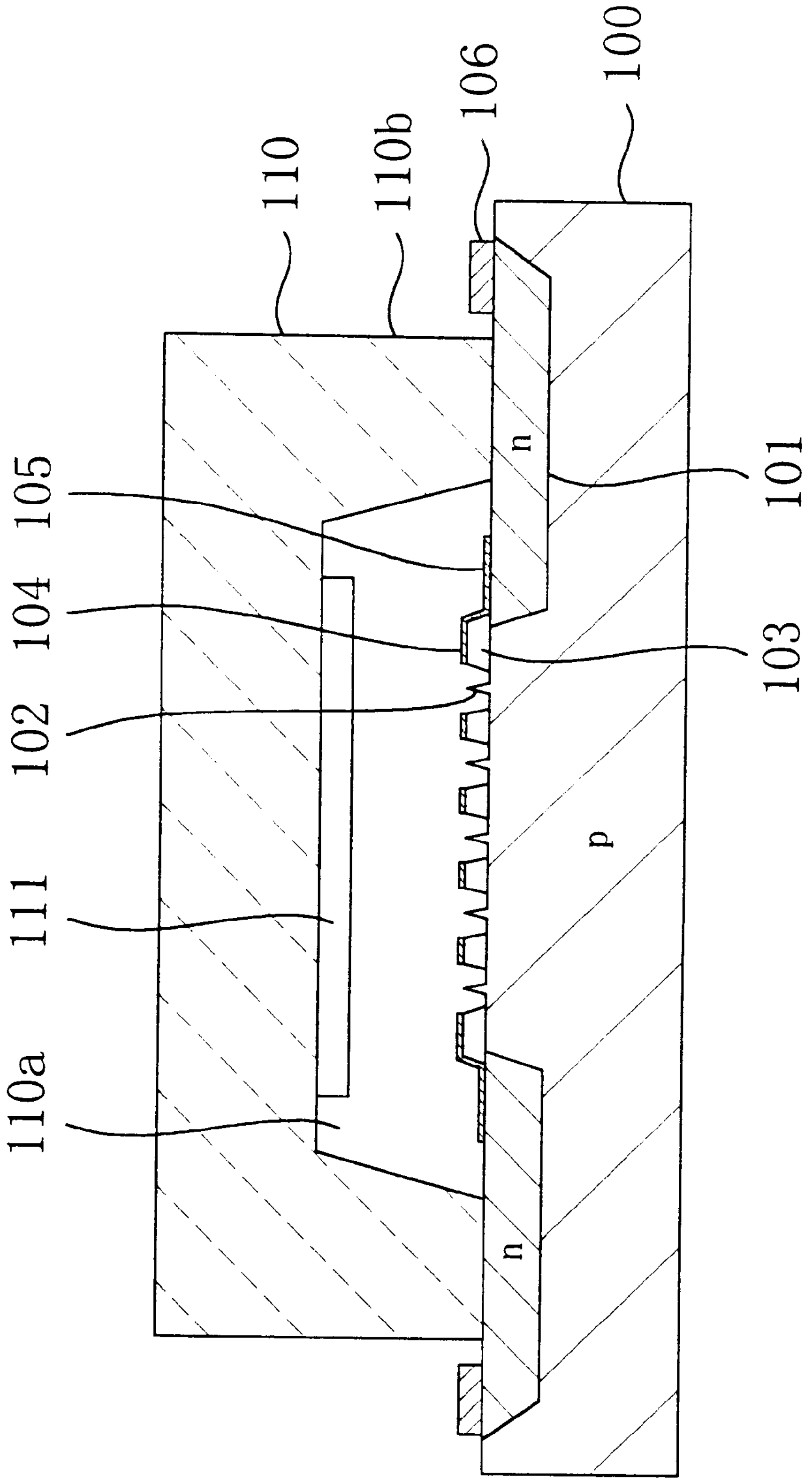
Fig. 6 Prior Art
FIG. 6 is a sectional view of a conventional vacuum-sealed field-emission electron source.
Figure 7:
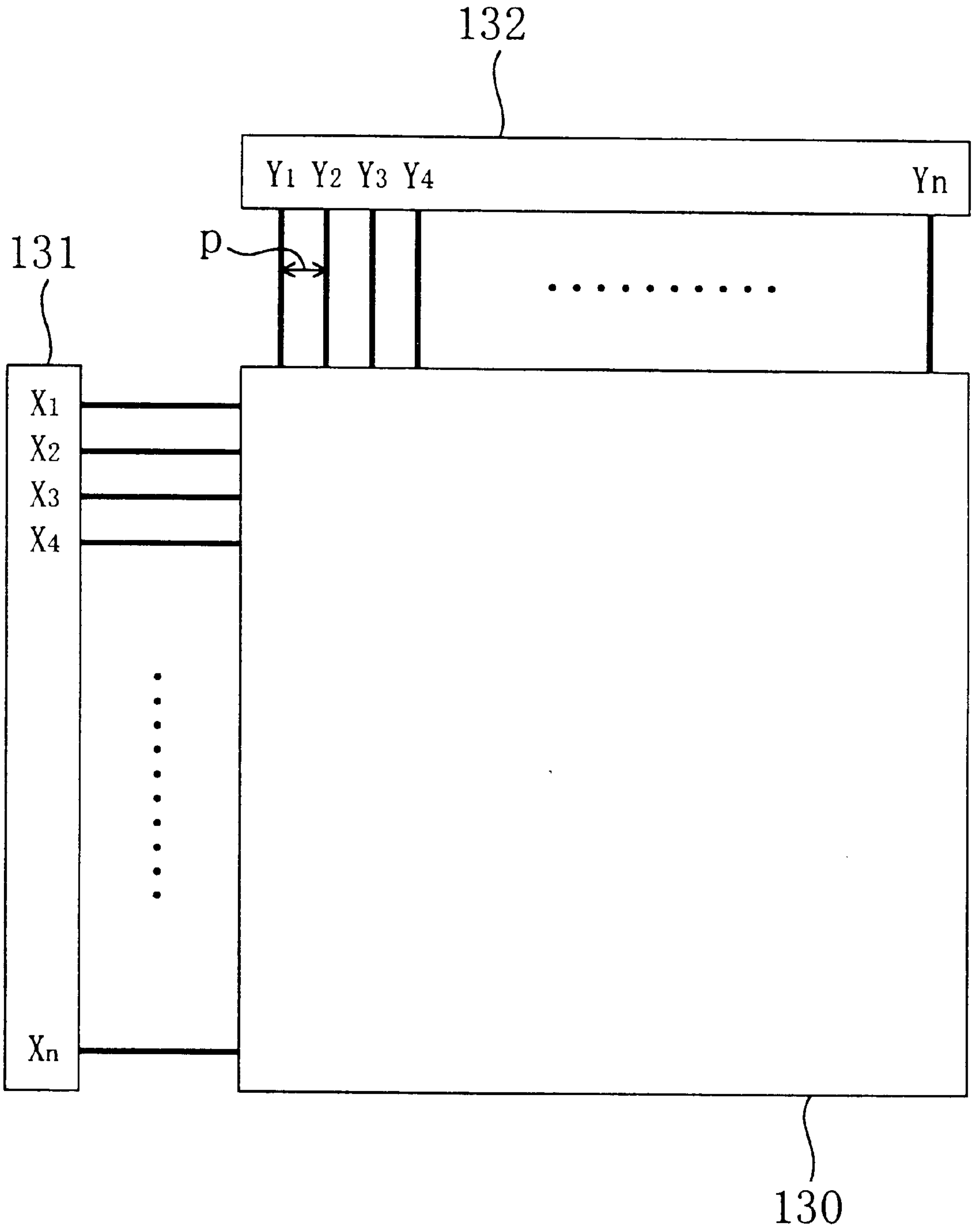
Fig. 7 Prior Art
FIG. 7 is a diagram of a circuit configuration for line control in a matrix display panel to which a field-emission electron source is applied.

Then, as is shown in FIG. 4(*a*), the second silicon oxide film 16 and a conductive film 34 to be used as the withdrawn electrode 14 are successively deposited on the first silicon oxide film 15 by vacuum deposition. By introducing an ozone gas during the vacuum deposition of the second silicon oxide film 16, the resultant second silicon oxide film 16 can attain a good insulating property. Also, when a Nb metal film is used as the conductive film 34, the resultant withdrawn electrode 14 can attain satisfactory uniformity through a lift-off process described below.

Next, the wet etching is performed in an ultrasonic atmosphere by using a buffered solution of hydrofluoric acid, the second silicon oxide film 16 on the side and top faces is selectively removed, and the conductive film 34 on the silicon oxide mask 31 is lift off. In this manner, the withdrawn electrode 14 having a small opening and the cathode 13 are exposed as is shown in FIG. 4(*b*).

Then, as is shown in FIG. 5(*a*), after a transparent and conductive ITO film is deposited on the transparent and insulating sealing cover 20 in the shape of a flat plate, the ITO film is patterned into the anode 21.

Next, after depositing a silicon oxide film having an insulating property on the entire surface of the sealing cover 20, the silicon oxide film is selectively etched, so that the periphery thereof can remain. In this manner, the circular sealing material 18 is formed in the periphery of the sealing cover 20 as is shown in FIG. 5(*b*). Thereafter, the surface of the circular sealing material 18 is flattened by the CMP (chemical mechanical polishing) or the like.

Then, the fluorescent thin film 22 is formed in a predetermined portion on the anode 21 as is shown in FIG. 5(*c*).

Ultimately, as is shown in FIG. 5(*d*), the silicon substrate 10 resulting from the process shown in FIG. 4(*b*) and the sealing cover 20 resulting from the process shown in FIG. 5(*c*) are opposed face-to-face and positioned with each other, and then are integrated with the circular sealing material 18 disposed therebetween. Thereafter, the space formed among the silicon substrate 10, the sealing cover 20 and the circular sealing material 18 is vacuated until the predetermined degree of vacuum is attained, and the space is vacuum-sealed with a glass sealing material with a low melting point or the like. In this manner, the vacuum-sealed field-emission electron source as is shown in FIG. 1 can be manufactured.

What is claimed is:

1. A vacuum-sealed field-emission electron source comprising:

- a semiconductor substrate;
- a recess portion, having a depth, formed in said semiconductor substrate;
- a cathode formed on a bottom of said recess portion of said semiconductor substrate out of a semiconductor material;
- a withdrawn electrode, for causing electron emission from said cathode, formed out of a conductive material on the bottom of said recess portion of said semiconductor substrate with an insulating layer disposed therebelow, said withdrawn electrode having an opening in a position corresponding to said cathode;
- a sealing cover made from a transparent and insulating flat plate and disposed so as to cover said recess portion of said semiconductor substrate;
- an anode, for converging electrons emitted from said cathode, formed out of a conductive material on a surface of said sealing cover opposing said semiconductor substrate; and
- a withdrawn electrode wire formed on a side face of said recess portion of said semiconductor substrate and on a top face of a protrusion portion formed around said recess portion, one end of said withdrawn electrode wire being connected with said withdrawn electrode and the other end extending to the outside,
- wherein a space formed by said semiconductor substrate and said sealing cover is retained to be vacuated, and wherein the depth of said recess portion affects the distance between said cathode and said anode.

2. The vacuum-sealed field-emission electron source of claim 1, further comprising an insulating circular sealing material disposed between said semiconductor substrate and said sealing cover so as to surround said recess portion.

3. The vacuum-sealed field-emission electron source of claim 2,

- wherein said circular sealing material is integrated with said sealing cover, and
- a face of said circular sealing material in contact with said semiconductor substrate is flattened.

4. The vacuum-sealed field-emission electron source of claim 2, further comprising:

- a fluorescent thin film formed on a surface of said anode opposing said semiconductor substrate; and
- an anode wire formed on the surface of said sealing cover opposing said semiconductor substrate, one end of said anode wire being connected with said anode and the other end extending to the outside through said circular sealing material.

5. The vacuum-sealed field-emission electron source of claim 4,

- wherein said withdrawn electrode wire extends along one direction, and said anode wire extends along another direction crossing the extending direction of said withdrawn electrode.

6. A method of manufacturing a vacuum-sealed field-emission electron source, comprising:

- a recess forming step of forming a recess portion in a semiconductor substrate by forming a circular etching mask on said semiconductor substrate and conducting etching on said semiconductor substrate by using said etching mask;
- a cathode forming step of forming a cathode on a bottom of said recess portion of said semiconductor substrate out of a semiconductor material;
- a withdrawn electrode forming step of successively depositing an insulating film and a conductive film on an entire surface of said semiconductor substrate, removing said conductive film in a periphery portion of said cathode and patterning said conductive film, so as to form a withdrawn electrode, for causing electron emission from said cathode, having an opening in a position corresponding to said cathode, on the bottom of said recess portion of said semiconductor substrate with said insulating film disposed therebelow, and so as to form a withdrawn electrode wire one end of which is connected with said withdrawn electrode and the other end of which extends to an edge of said semiconductor substrate;

an anode forming step of forming, on a sealing cover made from a transparent and insulating flat plate, an anode of a conductive material for converging electrons emitted by said cathode, and forming an anode wire one end of which is connected with said anode and the other end of which extends to an edge of said sealing cover;

a fluorescent thin film forming step of forming a florescent thin film on said anode;

a sealing material forming step of forming a circular sealing material having a flattened surface on a periphery of said sealing cover; and a vacuum-sealing step of integrating said semiconductor substrate and said sealing cover with said circular sealing material disposed therebetween and vacuating a space formed by said semiconductor substrate, said sealing cover and said sealing material.

7. The method of manufacturing a vacuum-sealed field-emission electron source of claim 6, wherein said semiconductor substrate is a crystalline substrate, and said etching conducted in said recess portion forming step is crystal anisotropic etching.

8. The method of manufacturing a vacuum-sealed field-emission electron source of claim 6, wherein said sealing material forming step includes a step of flattening the surface of said circular sealing material by chemical mechanical polishing.

* * * * *